(12) United States Patent
Kan

(10) Patent No.: US 9,983,991 B2
(45) Date of Patent: May 29, 2018

(54) DATA STORAGE BASED ON RANK MODULATION IN SINGLE-LEVEL FLASH MEMORY

(71) Applicant: Empire Technology Development LLC, Wilmington, DE (US)

(72) Inventor: Edwin Kan, Ithaca, NY (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days. days.

(21) Appl. No.: 15/712,475

(22) Filed: Sep. 22, 2017

(65) Prior Publication Data

US 2018/0011785 A1   Jan. 11, 2018

Related U.S. Application Data

(63) Continuation of application No. 14/488,125, filed on Sep. 16, 2014, now Pat. No. 9,772,935.

(51) Int. Cl.
*G06F 12/00* (2006.01)
*G11C 7/10* (2006.01)
*G11C 16/10* (2006.01)

(52) U.S. Cl.
CPC ............ *G06F 12/00* (2013.01); *G11C 7/1006* (2013.01); *G11C 16/10* (2013.01)

(58) Field of Classification Search
CPC .. G06F 12/0246; G06F 12/0238; G06F 12/00; G06F 11/1072; G06F 11/1068; G06F 11/1012; G06F 11/1016; G06F 3/0679; G11C 11/5628; G11C 7/1006; G11C 16/10; G11C 16/349
See application file for complete search history.

(56) References Cited

U.S. PATENT DOCUMENTS

| | | | |
|---|---|---|---|
| 4,107,550 | A | 8/1978 | Jacquart et al. |
| 4,686,554 | A | 8/1987 | Ohmi et al. |
| 4,701,884 | A | 10/1987 | Aoki et al. |
| 5,739,568 | A | 4/1998 | Kojima |
| 5,789,777 | A | 8/1998 | Kojima |
| 7,656,706 | B2 | 2/2010 | Jiang et al. |

(Continued)

FOREIGN PATENT DOCUMENTS

WO     2011156750 A2    12/2011

OTHER PUBLICATIONS

"NVM Technology Overview," SAIFUN, accessed at https://web.archive.org/web/20090217124831/http://www.saifun.com/content.asp?id=113, archived on Feb. 17, 2009, accessed on Aug. 18, 2017, pp. 2.

(Continued)

*Primary Examiner* — Mano Padmanabhan
*Assistant Examiner* — William E. Baughman
(74) *Attorney, Agent, or Firm* — Turk IP Law, LLC

(57) ABSTRACT

Technologies are generally described to store data in single-level memory using rank modulation. In some examples, data to be encoded to single-level memory may be represented with a bit ranking for a group of bits. A program vector may then be determined from the bit ranking and partial program characteristics associated with the memory group(s). The memory group(s) may then be programmed according to the program vector. The encoded data may be subsequently retrieved by performing a series of partial programming operations on the memory group(s) to recover the bit ranking and derive the data represented.

20 Claims, 9 Drawing Sheets

(56) References Cited

U.S. PATENT DOCUMENTS

| | | |
|---|---|---|
| 8,225,180 B2 | 7/2012 | Jiang et al. |
| 8,245,094 B2 | 8/2012 | Jiang et al. |
| 2004/0004218 A1 | 1/2004 | Jinno |
| 2007/0014153 A1 | 1/2007 | Gorobets et al. |
| 2007/0025150 A9 | 2/2007 | Lee |
| 2012/0170626 A1 | 7/2012 | Adachi |
| 2013/0013870 A1 | 1/2013 | Cronie et al. |
| 2013/0121084 A1 | 5/2013 | Jeon et al. |
| 2013/0254466 A1 | 9/2013 | Jiang et al. |
| 2013/0268723 A1 | 10/2013 | Jiang et al. |

OTHER PUBLICATIONS

"Open NAND Flash Interface," Discover the advantages of an ONFi world, accessed at https://web.archive.org/web/20140819053101/http://www.onfi.org/, archived on Aug. 19, 2014, accessed on Aug. 18, 2017, pp. 2.

"Sandisk Launches 64 Gigabyte Solid State Drives for Notebook PCS, Meeting Needs for Higher Capacity," accessed at https://www.sandisk.com/about/media-center/press-releases/2007/2007-06-04-sandisk-launches-64-gigabyte-solid-state-drives-for-notebook-pcs,-meeting-needs-for-higher-capacity, Jun. 4, 2007, pp. 5.

"Web-Feet Research," accessed at https://web.archive.org/web/20121029091745/http://www.web-feetresearch.com/default.aspx, archived on Oct. 29, 2012, accessed on Aug. 21, 2017, pp. 2.

Arikan, E., "Channel polarization: A method for constructing capacity achieving codes for symmetric binary-input memoryless channels," IEEE Transactions on Information Theory, vol. 55, Issue 7, pp. 3051-3073 (Jul. 20, 2009).

Arikan, E., and Telatar, E., "On the Rate of Channel Polarization," IEEE international conference on Symposium on Information Theory, vol. 3, pp. 1493-1495 (Jun. 28-Jul. 3, 2009).

Aritome, S., et al., "Reliability Issues of Flash Memory Cells," Proceedings of the IEEE, vol. 81, No. 5, pp. 776-788 (May 1993).

Barg, A., and Mazumdar, A., "Codes in Permutations and Error Correction for Rank Modulation," IEEE Transactions on Information Theory, vol. 56, Issue 7, pp. 3158-3165 (Jul. 2010).

Barr, C.S., "PQI unveils 256GB solid state drive," Slash Gear, accessed at https://web.archive.org/web/20131114234912/http://www.slashgear.com/pqi-unveils-256gb-ssd-drive-315520/, May 31, 2007, pp. 7.

Burshtein, D., and Strugatski, A., "Polar write once memory codes", IEEE International Symposium on Information Theory Proceedings, pp. 1972-1976 (Jul. 2012).

Burshtein, D., and Strugatski, A., "Polar write once memory codes," IEEE Transactions on Information Theory, vol. 59, Issue 8, pp. 5088-5101 (Aug. 2013).

Farnoud, F., et al., "Rank Modulation for Translocation Error Correction," IEEE International Symposium on Information Theory Proceedings (ISIT), pp. 2988-2992 (Jul. 1-6, 2012).

Fiat, A., and Shamir, A., "Generalized "Write-Once" Memories," IEEE Transactions on Information Theory, vol. 30, Issue 3, pp. 470-480 (May 1984).

Fu, F-W., and Vinck, A.J.H., "On the Capacity of Generalized Write-Once Memory with State Transitions Described by an Arbitrary Directed Acyclic Graph," IEEE Transactions on Information Theory, vol. 45, Issue 1, pp. 308-313 (Jan. 1999).

Gad, E.E., et al., "Compressed Encoding for Rank Modulation," IEEE International Symposium on Information Theory (ISIT), pp. 884-888 (Jul. 31-Aug. 5, 2011).

Gad, E.E., et al., "On a Construction for Constant-Weight Gray Codes for Local Rank Modulation," IEEE 26th Convention of Electrical and Electronics Engineers in Israel (IEEEI), p. 996 (Nov. 17-20, 2010).

Gad, E.E., et al., "Rank-Modulation Rewrite Coding for Flash Memories," IEEE International Symposium on Information Theory Proceedings (ISIT), pp. 704-708 (Jul. 7-12, 2013).

Gal, E., and Toledo, S., "Algorithms and Data Structures for Flash Memories," ACM Computing Surveys (CSUR), vol. 37, No. 2, pp. 138-163 (Jun. 2005).

Heegard, C., "On the Capacity of Permanent Memory," IEEE Transactions on Information Theory, vol. 31, No. 1, pp. 34-42 (Jan. 1985).

International Search Report and Written Opinion for International Patent Application No. PCT/US15/44640, dated Nov. 5, 2015, pp. 8.

International Search Report and Written Opinion for International Patent Application No. PCT/US2013/030043, dated Jun. 27, 2013, pp. 11.

Jiang, A., and Bruck, J., "Information Representations and Coding for Flash Memories," IEEE Pacific Rim Conference on Communications, Computers and Signal Processing, pp. 920-925 ( Aug. 23-26, 2009).

Jiang, A., and Wang, Y., "Rank modulation with multiplicity," IEEE GLOBECOM Workshops (GC Wkshps), pp. 1866-1870 (Dec. 6-10, 2010).

Jiang, A., et al., "Correcting Charge-Constrained Errors in the Rank-Modulation Scheme," IEEE Transactions on Information Theory, vol. 56, Issue 5, pp. 2112-2120 (May 2010).

Jiang, A., et al., "Rank modulation for flash memories," IEEE Transactions on Information Theory, vol. 55, Issue 6, pp. 2659-2673 (Jun. 2009).

Jiang, A., et al., "Rewriting Codes for Joint Information Storage in Flash Memories," IEEE Transactions on Information Theory, vol. 56, Issue 10, pp. 5300-5313 (Oct. 2010).

Jiang, A., et al., "Universal Rewriting in Constrained Memories," IEEE International Symposium on Information Theory, pp. 1219-1223 (Jun. 28-Jul. 3, 2009).

Kim, M., et al., "Rank Modulation Hardware for Flash Memories," IEEE 55th International Midwest Symposium on Circuits and Systems (MWSCAS), pp. 294-297 (Aug. 5-8, 2012).

Kløve, T., "Spheres of permutations under the infinity norm—permutations with limited displacement," University of Bergen, Bergen, Norway, Technical Report No. 376, p. 38 (Nov. 2008).

Knuth, D.E., "Efficient balanced codes," IEEE Transactions on Information Theory, vol. 32, No. 1, pp. 51-53 (Jan. 1986).

Korada, S.B., and Urbanke, R.L., "Polar Codes are Optimal for Lossy Source Coding," IEEE Transactions on Information Theory, vol. 56, No. 4, pp. 1751-1768 (Apr. 2010).

Mazumdar, A. et al., "Constructions of Rank Modulation Codes," IEEE International Symposium on Information Theory Proceedings, pp. 869-873 (Jul. 31-Aug. 5, 2011).

Mazumdar, A., et al., "Constructions of Rank Modulation Codes," IEEE Transactions on Information Theory, vol. 59, Issue 2, pp. 1018-1029 (Oct. 2, 2012).

Pavan, P., et al., "Flash Memory Cells—An Overview," Proceedings of the IEEE, vol. 85, No. 8, pp. 1248-1271 (Aug. 1997).

Rabaey, J.M., et al., "Timing issues in digital circuits," in Digital Integrated Circuits: A Design Perspective, 2nd Edition, Chapter 10, pp. 42-99, Chandrakasan, A.P., and Nikolic, B., eds., Prentice Hall (2003).

Rivest, R.L., and Shamir, A., "How to Reuse a "Write-Once" Memory," Information and Control, vol. 55, No. 1-3, pp. 1-19 ( Oct.-Dec. 1982).

Schwartz, M., "Constant-Weight Gray Codes for Local Rank Modulation," IEEE International Symposium on Information Theory Proceedings (ISIT), pp. 869-873 (Feb. 7, 2010).

Suh, G.E., and Devadas, S., "Physical Unclonable Functions for Device Authentication and Secret Key Generation," Proceedings of the 44th annual Design Automation Conference, pp. 9-14 (Jun. 4-8, 2007).

Tamo, I., and Schwartz, M., "Correcting Limited-Magnitude Errors in the Rank-Modulation Scheme," IEEE Transactions on Information Theory, vol. 56, No. 6, pp. 2551-2560 (Jul. 30, 2009).

Wang, Y., et al., "Flash Memory for Ubiquitous Hardware Security Functions: True Random Number Generation and Device Fingerprints," Proceedings of the 2012 IEEE Symposium on Security and Privacy, pp. 33-47 (May 20-25, 2012).

(56) References Cited

OTHER PUBLICATIONS

Wang, Z., and Bruck, J., "Partial Rank Modulation for Flash Memories," IEEE International Symposium on Information Theory Proceedings (ISIT), pp. 864-868 (Jun. 13-18, 2010).

Wang, Z., et al., "On the Capacity of Bounded Rank Modulation for Flash Memories," IEEE International Symposium on Information Theory (ISIT), pp. 1234-1238 (Jun. 28-Jul. 3, 2009).

Wu, Y., and Jiang, A., "Position Modulation Code for Rewriting Write-Once Memories," IEEE Transactions on Information Theory, vol. 57, No. 6, pp. 3692-3697 (Jun. 2011).

Yaakobi, E., et al., "Multiple Error-Correcting WOM-Codes," IEEE Transactions on Information Theory, vol. 58, No. 4, pp. 2220-2230 (Apr. 2012).

Yan, N. et al., "RFID Tag Chip Design," in RFID Systems: Research Trends and Challenges, Chapter 4, pp. 99-128, Bolic, M., et al., eds., John Wiley & Sons (Sep. 23, 2010).

Zhang, F., et al., "LDPC Codes for Rank Modulation in Flash Memories," IEEE International Symposium on Information Theory Proceedings (ISIT), pp. 859-863 (Jun. 13-18, 2010).

Cover, T.M., and Thomas, J.A., "Strongly Typical Sequences and Rate Distortion," in Elements of Information Theory, 2nd Edition, Chapter 10.6, pp. 325-328, John Wiley & Sons, Inc., (Jun. 2006).

FIG. 2

| | 201 | 202 | 203 | 204 | 205 | 206 | 207 | 208 |
|---|---|---|---|---|---|---|---|---|
| 220 INITIAL READOUT | 0 | 0 | 0 | 0 | 0 | 1 | 0 | 0 |
| 230 PULSES TO BITS | 0 | 0 | 0 | 0 | 0 | 1 | 0 | 1 |
| 232 PULSES TO BITS | 0 | 0 | 1 | 0 | 0 | 1 | 0 | 1 |
| 234 PULSES TO BITS | 0 | 0 | 1 | 0 | 1 | 1 | 0 | 1 |
| 236 PULSES TO BITS | 1 | 0 | 1 | 0 | 1 | 1 | 0 | 1 |
| 238 PULSES TO BITS | 1 | 1 | 1 | 0 | 1 | 1 | 0 | 1 |
| 240 PULSES TO BITS | 1 | 1 | 1 | 1 | 1 | 1 | 0 | 1 |
| 242 PULSES TO BITS | 1 | 1 | 1 | 1 | 1 | 1 | 1 | 1 |
| 250 FULL ERASE | 0 | 0 | 0 | 0 | 0 | 0 | 0 | 0 |

210 RETRIEVING READ PROCESS FOR DATA HAVING RANK REPRESENTATION (206 208 203 205 201 202 204 207)

410 MODIFIED READ FOR PROGRAM VERIFICATION OF RANKING (206 208 203 205 201 202 204 207) WITH INITIAL PROGRAM VECTOR ("9X" "8X" "7X" "6X" "5X" "4X" "3X" "2X")

| | 201 | 202 | 203 | 204 | 205 | 206 | 207 | 208 |
|---|---|---|---|---|---|---|---|---|
| 420 INITIAL READOUT | 0 | 0 | 0 | 0 | 0 | 1 | 0 | 0 |
| 430 "X" PULSES TO ZERO BITS; DELAYED MATRICULATION ERROR FOR 208 | 0 | 0 | 0 | 0 | 0 | 1 | 0 | 0 |
| 432 ADDITIONAL PULSES TO 206, 208 UNTIL CORRECT | 0 | 0 | 0 | 0 | 0 | 1 | 0 | 1 |
| 440 "X" PULSES TO ZERO BITS | 0 | 0 | 1 | 0 | 0 | 1 | 0 | 1 |
| 450 "X" PULSES TO ZERO BITS | 0 | 0 | 1 | 0 | 1 | 1 | 0 | 1 |
| 460 "X" PULSES TO ZERO BITS; PREMATURE MATRICULATION ERROR FOR 202 | 1 | 1 | 1 | 0 | 1 | 1 | 0 | 1 |
| 470 "X" PULSES TO ZERO BITS | 1 | 1 | 1 | 0 | 1 | 1 | 0 | 1 |
| 480 "X" PULSES TO ZERO BITS; PREMATURE MATRICULATION ERROR FOR 207 | 1 | 1 | 1 | 1 | 1 | 1 | 1 | 1 |

FIG. 4

| | | 201 | 202 | 203 | 204 | 205 | 206 | 207 | 208 |
|---|---|---|---|---|---|---|---|---|---|
| 510 | PROGRAM AND VERIFY OF RANKING (206 208 203 205 201 202 204 207) IN BIT-LEVEL PROGRAM/ERASE MEMORY WITH INITIAL PROGRAM VECTOR ("9X" "8X" "7X" "6X" "5X" "4X" "3X" "2X") | | | | | | | | |
| 520 | INITIAL READOUT | 0 | 0 | 0 | 0 | 0 | 1 | 0 | 0 |
| 530 | "X" PULSES TO ZERO BITS; DELAY MATRICULATION ERROR FOR 208 | 0 | 0 | 0 | 0 | 0 | 1 | 0 | 0 |
| 532 | ADDITIONAL PULSES TO 206, 208 UNTIL CORRECT | 0 | 0 | 0 | 0 | 0 | 1 | 0 | 1 |
| 540 | "X" PULSES TO ZERO BITS | 0 | 0 | 1 | 0 | 0 | 1 | 0 | 1 |
| 550 | "X" PULSES TO ZERO BITS | 0 | 0 | 1 | 0 | 1 | 1 | 0 | 1 |
| 560 | "X" PULSES TO ZERO BITS; PREMATURE MATRICULATION ERROR FOR 202 | 1 | 1 | 1 | 0 | 1 | 1 | 0 | 1 |
| 562 | ERASE PULSES TO 202, 204, AND 207 UNTIL CORRECT | 1 | 0 | 1 | 0 | 1 | 1 | 0 | 1 |
| 570 | "X" PULSES TO ZERO BITS | 1 | 1 | 1 | 0 | 1 | 1 | 0 | 1 |
| 580 | "X" PULSES TO ZERO BITS; PREMATURE MATRICULATION ERROR FOR 207 | 1 | 1 | 1 | 1 | 1 | 1 | 1 | 1 |
| 582 | ERASE PULSES TO 207 UNTIL CORRECT | 1 | 1 | 1 | 1 | 1 | 1 | 0 | 1 |

FIG. 5

DATA STORAGE BASED ON RANK MODULATION IN SINGLE-LEVEL FLASH MEMORY

CROSS-REFERENCE TO RELATED APPLICATION

The present application is a continuation application under 35 U.S.C. § 120 of U.S. patent application Ser. No. 14/488,125, filed on Sep. 16, 2014, now U.S. Pat. No. 9,772,935.

BACKGROUND

Unless otherwise indicated herein, the materials described in this section are not prior art to the claims in this application and are not admitted to be prior art by inclusion in this section.

Flash memory is a type of nonvolatile memory (NVM) that stores information in memory cells that include floating gate transistors. Flash memory may be single-level cell (SLC) or multi-level cell (MLC) devices. An SLC flash memory device may be configured to distinguish between two different charge levels on memory cells, thereby allowing an individual memory cell to store a single bit of information. In contrast, an MLC flash memory device may be configured to distinguish between four or more different charge levels on individual memory cells, thereby allowing an individual memory cell to store multiple bits of information. However, SLC devices may have better data read and write performance than MLC devices due to having to distinguish between two different charge levels, as compared to four or more different charge levels.

SUMMARY

The present disclosure generally describes techniques to store data in single-level memory using rank modulation.

According to some examples, methods to encode data on single-level flash memory by use of rank modulation are described. An example method may include determining a bit ranking within a group of bits based on the data to be encoded; determining a plurality of partial program parameters for a plurality of flash memory bits, where each partial program parameter is associated with a respective bit in the plurality of bits; determining a program vector based on the determined bit ranking and the determined plurality of partial program parameters; and/or encoding the data to the plurality of bits using partial programming based on the determined program vector.

According to other examples, an apparatus may be configured to write data in single-level flash memory by use of rank modulation. An example apparatus may include a processing block configured to determine a bit ranking based on a data to be written; determine a plurality of complete program durations for a plurality of bits of a flash memory, where each complete program duration indicates a respective program time duration to modify a respective bit in the plurality of bits from a first value to a second value; and determine a program vector based on the determined bit ranking and the determined plurality of complete program durations, the program vector being indicative of at least one partial program duration. The example apparatus may also include a memory interlace module coupled to the processing block. The memory interface module may be configured to receive the determined program vector from the processing block; and write the data to the plurality of bits by partial program of the plurality of bits according to the at least one partial program duration indicated by the received program vector.

According to further examples, methods to retrieve data encoded in single-level flash memory by use of rank modulation may be described. An example method may include performing a plurality of read operations on a plurality of bits of the flash memory, where each read operation includes partially programming the plurality of bits based on at least one partial program parameter; and reading a state of the partially-programmed plurality of bits. The example method may also include determining a ranking associated with the plurality of bits based on at least the respective read states associated with the plurality of read operations and deriving a final data based on the determined ranking.

According to yet other examples, an apparatus may be configured to retrieve data encoded in single-level flush memory by use of rank modulation. The apparatus may include a memory interface module coupled to a plurality of flash memory bits and a processing block coupled to the memory interface module. The memory interface module may read an initial state of the plurality of flash memory bits and perform a plurality of read operations on the plurality of bits by performance of a partial program of the plurality of bits based on at least one partial program duration, where the at least one partial program duration indicates a program time to partially modify at least one bit in the plurality of bits from a first value to a second value, and performance of a read of a state of the partially-programmed plurality of bits. The processing block may receive, from the memory interface module, the respective read states associated with the plurality of read operations; determine a ranking associated with the plurality of bits based on the respective read states; and derive a final data based on the ranking.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 2 illustrates an example retrieving read process to recover data stored in single-level memory using rank modulation;

FIG. 4 illustrates an example of the read-and-verify process to derive a program vector to write rank-modulated data into single-level memory;

FIG. 5 illustrates an example of the read-and-verify process to derive a program vector to write rank-modulated data into single-level memory having bit-level erase capability;

DETAILED DESCRIPTION

Figure 1:
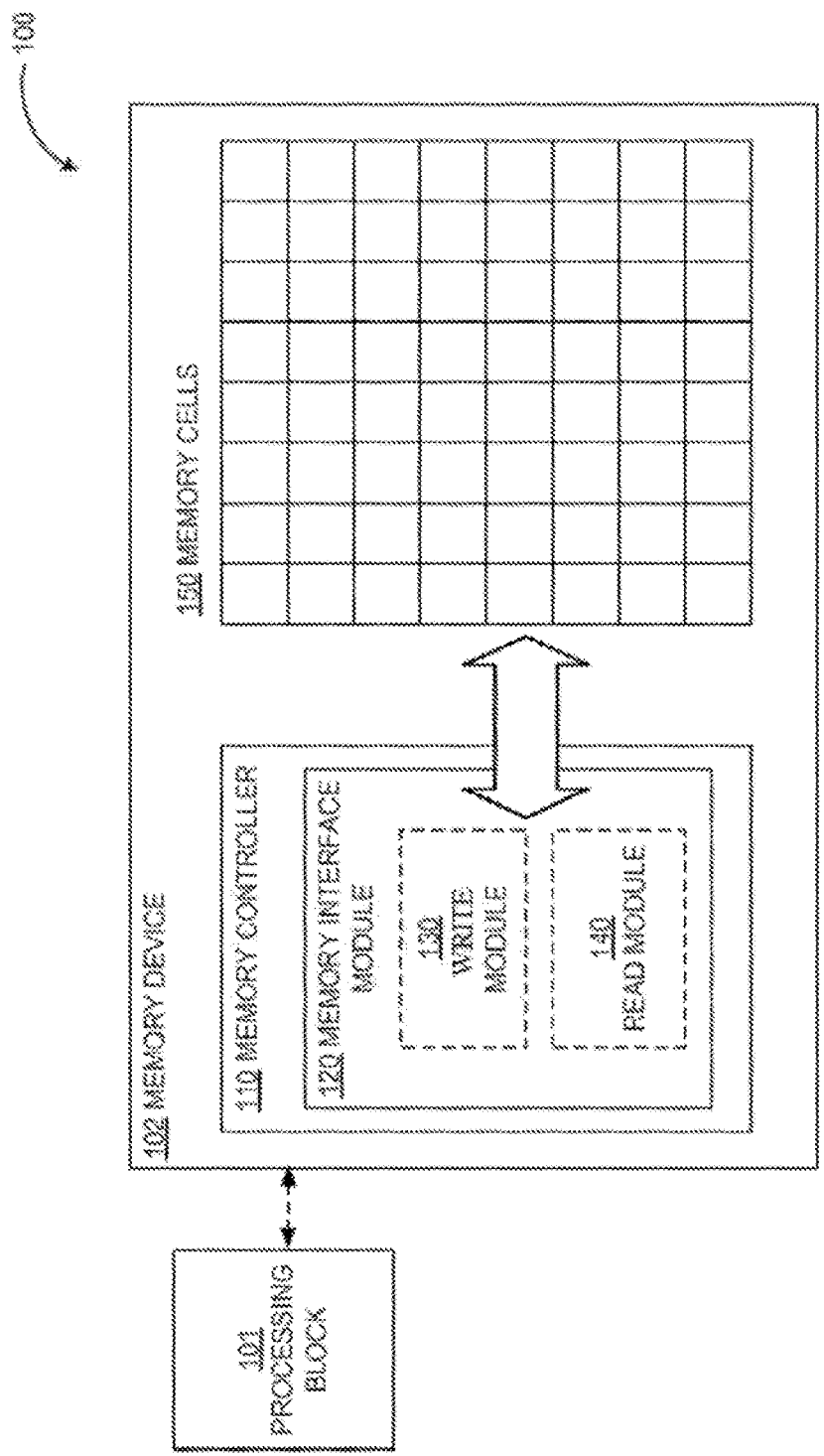
FIG. 1 illustrates an example memory device wherein data storage based on rank modulation may be implemented.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and/or computer program products related to storing data in single-level memory using rank modulation.

Briefly stated, technologies are generally described to store data in single-level memory using rank modulation. In some examples, data to be encoded to single-level memory may be represented with a bit ranking for a group of bits. A program vector may then be determined from the bit ranking and partial program characteristics associated with the memory group(s). The memory group(s) may then be programmed according to the program vector. The encoded data may be subsequently retrieved by performing a series of partial programming operations on the memory group(s) to recover the bit ranking and derive the data represented.

FIG. 1 illustrates an example memory device wherein data storage based on rank modulation may be implemented, arranged in accordance with at least some embodiments described herein.

According to a diagram 100, an apparatus may include, for example, a processing block 101 and a memory device 102, which, in turn, may include a memory controller 110 and memory cells 150. The processing block 101 may execute instructions stored in the memory device 102 and/or store data resulting from the operations in the memory device 102. The memory controller 110 may include a memory interface module 120, which, in turn, may include a write module 130 and a read module 140. The memory controller 110, the memory interface module 120, and/or the write module 130/read module 140 when present, may be communicatively coupled to the memory cells 150 to read, write, or adjust stored data in the memory cells 150. The memory controller 110, the memory interface module 120, and/or the write module 130/read module 140, may be implemented in hardware, software or other computer-readable instructions stored on a computer-readable medium and executable by one or more processors, or a combination thereof.

In some embodiments, the memory cells 150 may include flash memory cells, and may be implemented using floating-gate transistors. The memory cells 150 may be implemented using single-level cell (SLC) technology or multi-level cell (MLC) technology. In either case, the memory interface module 120 and/or the write module 130 may be configured to write data to the memory cells 150 using one or more write pulses, which may store charge onto and thereby raise the voltage of the floating gates associated with the memory cells.

In some embodiments, the change in threshold voltage of a memory cell as a function of the number of write pulses may be represented as:

$$\Delta V_{th} = c \cdot n$$

where n may be the number of write pulses and c may be a constant associated with the memory cell. In general, different memory cells, even in the same memory, may have different voltage thresholds and charging behavior due to manufacturing variations and dopant fluctuations in the cells. However, the equation above may still hold, with the possibility that different memory cells may be associated with different values of c.

In some embodiments, a single write pulse may not store sufficient charge at a memory cell to cause the threshold voltage of the memory cell to pass the next available voltage level, and multiple write pulses may be used in order to assure that the voltage of the memory cell passes the voltage level. In such embodiments, a memory cell may be programmed using a number of write pulses less than that required for passing the next voltage level. This is referred to as "partial programming" of the memory cell using a number of "partial program pulses". As a result, the memory cell may then be in a "partially programmed" state.

In other embodiments, a write operation may involve using a total write time duration of charge delivery in which a particular voltage is applied instead of a number of write pulses. While in this disclosure partial programming is described in the context of numbers of write pulses, partial programming may also be described in the context of write time durations equivalent to one or more write pulses. For example, the value of a bit may be switched from "0" to "1" upon either the application of a particular number of write pulses or the application of a write operation having a particular write time duration.

In some embodiments, MLC memory may be configured with four or more charge storage levels, allowing a single MLC bit to store multiple bits of information. One technique that may be used to further increase data storage capacity is rank modulation. In rank modulation, instead of using absolute charge levels on memory cells to store data, the relative order or rank of the charge levels on different cells may be used to store data. MLC memory may be well suited to rank modulation, because MLC memory is often configured with multiple stable and consistent levels across the entire memory, and the levels may allow threshold voltages of memory cells in a group to be ranked relatively simply. In comparison, SLC memory may not have sufficiently tight parameter control to enable more than two absolute levels across the entire memory. However, in some embodiments rank modulation may be implemented in SLC memory using partial programming of memory cells as described above.

FIG. 2 illustrates an example retrieving read process to recover data stored in single-level memory using rank modulation, arranged in accordance with at least some embodiments described herein.

According to a diagram 200, a retrieving read process 210 may be performed by applying partial program pulses to a series of bits 201-208 to retrieve rank-modulated data. At an initial readout operation 220, a memory controller (e.g., the memory controller 110) may read the values of the bits 201-208. As depicted in FIG. 2, the bits 201-205 and 207-208 may initially have "0" values while the bit 206 may have a "1" value. As a result, the bit 206 may be ranked first. At operation 230, the memory controller may partially program the bits 201-208 by applying a series of partial program pulses and then read the bits 201-208 again. The memory controller may apply the partial program pulses at operation 230 (and in subsequent operations) to all of the bits 201-208 or only to the bits with "0" values at the previous operation (e.g., bits 201-205 and 207-208 for operation 230). Regardless, after the partial program pulses are applied at operation 230, the bits 201-205 and 207 may remain at "0" while the bits 206 and 208 may be at "1". Since the bit 206 was previously already "1" at operation 220 and therefore has the top rank, the bit 208 may now be ranked second.

At operation 232 the memory controller may again apply a series of partial program pulses and read the bits 201-208 to determine that which bit 203 has changed from "0" to "1" and therefore may be ranked third. Similarly, at operations 234-242 the memory controller may continue to apply a series of partial program pulses and read the bits 201-208 to determine that the bit sequence 205, 201, 202, 204, and 207 have changed values and therefore may be ranked fourth, fifth, sixth, seventh, and eighth, respectively. The final bit rank for the data written in the bits 201-208, represented as an ordered vector (206, 208, 203, 205, 201, 202, 204, 207), may then be subsequently processed by the memory controller to recover the data encoded in rank modulation. After the last bit to change value (the bit 207) has been read, the bits 201-208 may be fully erased at operation 250 in preparation for subsequent data encoding.

Figure 3:
FIG. 3 illustrates an example of the programming process to write rank-modulated data into single-level memory.

FIG. 3 illustrates an example programming process to write rank-modulated data into single-level memory, arranged in accordance with at least some embodiments described herein.

According to a diagram 300, a program process 310 to write rank-modulated data to the bits 201-208 may be performed by a memory controller configured to apply partial program pulses to one or more of the bits 201-208. In the diagram 300, the program process 310 may be used to write the same rank-modulated data that was recovered in the retrieving read process 210 described in FIG. 2. As described above, the ordered bit rank vector recovered in the retrieving read process 210 was (206, 208, 203, 205, 201, 202, 204, 207), where the first bit in the vector (the bit 206) reached a "1" value first and the last bit in the vector (the bit 207) reached a "1" value last. In order to prepare the bits 201-208 to change values as shown in the vector, each of the bits 201-208 may be programmed using an appropriate number of partial program pulses. For example, assume that each of the bits 201-208 has substantially the same voltage level (as described above). In this cast, the bit 206, ranked first in the vector, may be programmed with the most partial program write pulses to bring the bit 206 closest (if not over) the level of "1". The bit 208, ranked second in the vector, may then be programmed with fewer write pulses than the bit 206, and so on through the ranked bits, until the last-ranked bit 207, which may be programmed with the fewest program pulses or even no program pulses at all.

In the diagram 300, a "1" value for a particular bit in a particular operation may indicate that program pulses are applied to that bit in that operation, whereas a "0" value may indicate that no program pulses are applied to that bit in that operation. At operation 320, the memory controller may apply a number "2X" of program pulses to all of the bits 201-208, as indicated by the "1" value for the bits 201-208. The "X" may represent a particular incremental number of partial program pulses, which may be determined based on the program characteristics of the bits 201-208. For example, the bits 201-208 may have different threshold voltages delineating the different possible stored bit values. As a result, the number of program pulses to change the value of one bit may differ from the number of program pulses to change the value of another bit. This variation in numbers of partial program pulses may be characterized using a mean $\alpha$ and a standard deviation $\Delta$. In turn, the incremental number write pulses "X" may be determined based on the $\alpha$ and the $\Delta$. For example, "X" may be derived by dividing $\alpha+3\Delta$ by the number of bits used to store a particular rank-modulated data. In some embodiments, the value of "X" may be different for different bits, and the memory controller may apply "X" write pulses to one bit and "X" program pulses to another bit, where the two "X" values differ.

At operation 330, the memory controller apply "X" program pulses to the bits 201-206 and 208, but not to the bit 207, as indicated by the associated "0" value. As mentioned above, the bit 207 ranks last in the ordered bit rank vector, and therefore may be programmed with the fewest program pulses. At operation 332, the memory controller may apply "X" program pulses to the bits 201-203, 205-206, and 208. At operation 334, the memory controller may apply "X" program pulses to the bits 201, 203, 205-206, and 208. At operation 336, the memory controller may apply "X" program pulses to the bits 203, 205-206, and 208. At operation 338, the memory controller may apply "X" program pulses to the bits 203, 206, and 208. At operation 340, the memory controller may apply "X" program pulses to the bits 206 and 208. At operation 342, the memory controller may apply "X" program pulses to the bit 206, after which programming may be considered complete for the data coded in rank modulation.

In some embodiments, the program process 310 may be described in the context of programming the bits 201-208 according to a program vector. The program vector may describe the number of program pulses to be applied to each bit in 201-208 arranged according to bit rank. For example, the ordered bit rank vector provided above is (206, 208, 203, 205, 201, 202, 204, 207). The corresponding program vector may be (206, 208, 203, 205, 201, 202, 204, 207)=("9X", "8X", "7X", "6X", "5X", "4X", "3X", "2X"). The first number of write pulses ("9X") may be the number of program pulses to be applied to the first bit in the bit rank vector (the bit 206), the second number of program pulses ("8X") may be the number of program pulses to be applied to the second bit (the bit 208), and so on. The program vector may also indicate a write time. An example of full program time in typical SLC may be 0.5 ms, which can be divided into 250 partial program pulses, each with a duration of 2 µs.

FIG. 4 illustrates an example read-and-verify process to derive a program vector to write rank-modulated data into SLC Flash, arranged in accordance with at least some embodiments described herein.

According to a diagram 400, a memory controller may use a read-and-verify process 410 to read the data written into the bits 201-208 and verify that the rank-modulated data represented by the program vector was correctly retrieved. The process 410 may use the same program vector described above for ease of description, although of course in other embodiments other program vectors may be read and verified.

At a first operation 420, the memory controller may read the values of the bits 201-208. As depicted in FIG. 4, the bits 201-205 and 207-208 may initially have "0" values while the bit 206 may have a "1" value, which correctly corresponds to the bit rank vector. At operation 430 the memory controller may then apply "X" program pulses to the bits 201-205 and 207-208 and subsequently may read the bits 201-208. Between normal operations, having one and only one bit switch from "0" to "1" may be useful. According to the program vector, after the program pulses applied in the operation 430, the bit 208 should switch from "0" to "1". However, the bit 208 is shown as still reading "0". This situation may be referred to as a "delayed matriculation" error, in which a bit should have switched values but did not. To correct this error, the memory controller may apply additional program pulses to the bit 208 at operation 432, determine whether the additional program pulses caused the bit 208 to switch, and continue applying additional program pulses until the bit 208 switches from "0" to "1". The memory controller may also apply the same number of additional program pulses to the bit 206 in order to ensure that the bit 206 ranks over the bit 208.

After determining, the number of program pulses to correct the delayed matriculation error, the memory controller may update the program vector with corrected program pulse numbers for the bit 208 and the bit 206. For example, if the memory controller applied an additional "X" program pulses to the bit 208 to cause the bit 208 to switch from "0" to "1", the memory controller may adjust the program vector to (206, 208, 203, 205, 201, 202, 204, 207)=("10X", "9X", "7X", "6X", "5X", "4X", "3X", "2X"), where "X" has been added to the program pulse numbers corresponding to the bits 206 and 208.

At operations 440 and 450, the memory controller may successively apply "X" program pulses to the remaining zero-value bits and subsequently read the bits 201-208 to determine whether the next ranked bits in the program vector (the bit 203 and the bit 205, respectively) switched values from "0" to "1". Upon determination that the bit 203 and the bit 205 did successively switch values from "0" to "1", the memory controller may again apply "X" program pulses to the remaining zero-value bits at operation 460 and subsequently read the bits 201-208. According to the program vector, the next ranked bit to switch values should be the bit 202. However, both the bits 201 and 202 switched values after the program pulse application in operation 460, where only one (the bit 201) bit should have switched. This situation may be referred to as a "premature matriculation" error, in which a bit (the bit 202) switched values when the bit should not have switched values. To correct this error, the memory controller may reduce the number of write pulses in the program vector associated with the bit 202. In order to maintain the bit ranking, the memory controller may also reduce the number of program pulses associated with the bits ranked lower than the bit 202 (that is, the bits 204 and 207) accordingly. After this reduction, the program vector may be (206, 208, 203, 205, 201, 202, 204, 207)=("10X", "9X", "7X", "6X", "5X", "3X", "2X", "X").

After the operation 460, the memory controller may again apply "X" program pulses to the remaining zero-value bits at operation 470 and subsequently read the bits 201-208. The bit that should have switched at operation 470 (the bit 202) already switched at operation 460 due to the premature matriculation error, so the lack of switching at operation 470 may not trigger a premature matriculation error. At next operation 480, the memory controller may again apply "X" write pulses to the remaining zero-value bits (the bits 204 and 207) and subsequently read the bits 201-208. As with operation 460, a premature matriculation error may occur in the operation 480 as depicted, with the bit 207 switching values when the bit 207 should not have switched values. Similar to the operation 460, the memory controller may correct this error by reducing the number of write pulses in the program vector associated with the bit 207. Since the bit 207 is the last-ranked bit, no other program pulse reduction may be performed. Subsequently, the adjusted program vector may be (206, 208, 203, 205, 201, 202, 204, 207)= ("10X", "9X", "7X", "6X", "5X", "3X", "2X", "0"), and may be used to re-program the bits 201-208 after full erasure.

The read-and-verify process 410 described above may be suitable for many flash memory implementations in which bit-level partial erase is unavailable. However, some non-volatile memory types, such as embedded single-poly NVM, may have bit-level partial program and erase capability, allowing enhanced read-and-verify processes. In some embodiments, such enhanced read-and-verify processes may have simpler and faster error handling and correction.

For example, in the read-and-verify process 410, the lowest number of program pulses in the original program vector may determine the number of premature matriculation errors that can be corrected without having to restart the read-and-verify process with a different program vector. Specifically, since the original program vector was (206, 208, 203, 205, 201, 202, 204, 207)=("9X", "8X", "7X", "6X", "5X", "4X", "3X", "2X"), the read-and-verify process 410 may only handle and correct two premature matriculation errors, bringing the last number of write pulses ("2X") to zero. Any additional premature matriculation errors may involve the use of a new program vector that can handle more premature matriculation errors, such as (206, 208, 203, 205, 201, 202, 204, 207)=("10X", "9X", "8X", "7X", "6X", "5X", "4X", "3X"). In comparison, read-and-verify processes able to take advantage of bit-level erase operations may not need this consideration.

FIG. 5 illustrates an example read-and-verify process to derive a program vector to write rank-modulated data into single-level memory having bit-level erase capability, arranged in accordance with at least some embodiments described herein.

According to a diagram 500, a memory controller may use a read-and-verify process 510 similar to the process 410 to read data written into the bits 201-208 and verify that rank-modulated data represented by a particular program vector was correctly written. As with the process 410, the process 510 may use the same program vector described above for ease of description, although in other embodiments other program vectors may be used.

Operations 520, 530, 532, 540, and 550 of the process 510 may be similar to the operations 420, 430, 432, 440, and 450 of the process 410, respectively. For example, the memory controller may initially read out data in the operation 520 as in the operation 420 and may apply "X" program pulses to zero-value bits in the operations 530, 540, and 550 as in the operations 430, 440, and 450. The memory controller may correct delay matriculation errors encountered in the operation 530 as in the operation 430 via the application of additional program pulses and subsequent correction of the program vector in the operation 532 as described in the corresponding operation 432.

At an operation 560, the memory controller may detect a premature matriculation error associated with the bit 202, as in the corresponding operation 460. However, in addition to reducing the number of program pulses in the program vector associated with the bit 202 and lower-ranked bits (the bits 204 and 207), the memory controller may also apply one or more erase pulses to the bits 202, 204, and 207 in an operation 562. In some embodiments, an erase pulse has the opposite functionality of a program pulse, and removes charge from the memory cell, thereby reducing the threshold voltage of the memory cell. The memory controller may apply erase pulses to the bits 202, 204, and 207 until bit 202 switches back to a "0" value. Subsequently, in an operation 570, the memory controller may again apply "X" program pulses to the remaining zero-value bits and subsequently read the bits 201-208, as in the operation 470. Unlike the operation 470, in the operation 570 the bit 202 may be able to switch because of the erase pulses applied at the operation 562. As a result, the memory controller may determine whether the bit 202 actually does switch at the operation 570.

At next operation 580, the memory controller may again apply "X" program pulses to the remaining zero-value bits (the bits 204 and 207) similar to the operation 480. As with operation 560, a premature matriculation error may occur in the operation 580 as depicted with the bit 207 switching values when the bit 207 should not have switched values. The memory controller may correct this error at operation 582 by reducing the number of program pulses in the program vector associated with the bit 207 as well as applying sufficient erase pulses to the bit 207 until the bit 207 switches back to a "0" value, similar to the operation 562.

Figure 6:
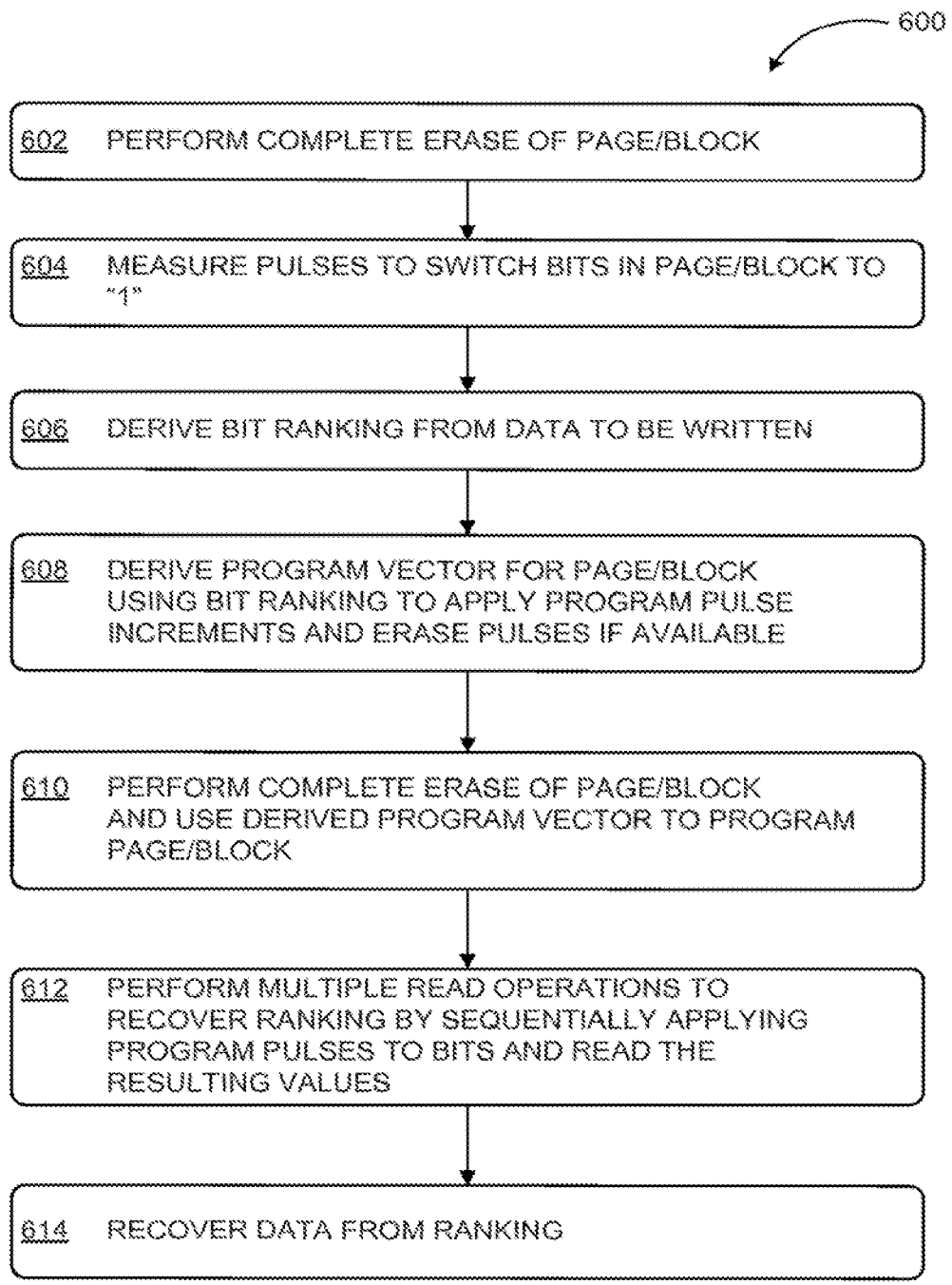
FIG. 6 is a flowchart illustrating an example process to program and to recover rank-modulated data on single-level memory using partial programming.

FIG. 6 is a flowchart illustrating an example process 600 to program and to recover rank-modulated data on single-level memory using partial programming, arranged in accordance with at least some embodiments described herein. Process 600 may include one or more operations, functions, or actions as illustrated by one or more of blocks 602-614. Although some of the blocks in process 600 (as well as in any other process/method disclosed herein) are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks representing other operations, functions, or actions may be provided.

According to process 600, rank-modulated data programming and recovery may begin at block 602 ("Perform complete erase of page/block"), where a memory controller (for example, the memory controller 110) may completely erase a memory page, block, or section in preparation for writing data. At block 604 ("Measure pulses to switch bits in page/block to '1'"), which may follow block 602, the memory controller may measure the number of program pulses and/or the program time duration to switch one or more of the bits in the memory page or block from a "0" value to a "1" value. In some embodiments, the memory controller and/or a processing block coupled to the memory controller may further derive one or more partial program characteristics associated with the memory page or block, such as the mean value of the number of program pulses $\alpha$, standard deviation $\Delta$, and/or an incremental number of program pulses "X" as described above. At block 606 ("Derive bit ranking from data to be written"), which may follow block 604, the memory controller and/or the processing block may determine a bit ranking from data to be written to the memory using rank modulation techniques. At block 608 ("Derive program vector for page/block using bit ranking to apply program pulse increments and erase pulses if available"), which may follow block 606, the memory controller or the processing block may derive a program vector as described above based on the determined bit ranking and available memory operations such as the application of bit-level write and/or erase pulses. In some embodiments, the program vector may be initially derived and then verified using a program-and-verify process as described above in FIGS. 4-5. At block 610 ("Perform complete erase of page/block and use derived program vector to program page/block"), which may follow block 608, the memory controller may again completely erase the memory page or block and use the program vector derived in block 608 to program the rank-modulated data to the memory page or block.

At block 612 ("Perform multiple read operations to recover ranking by sequentially applying write pulses to bits and reading the resulting values"), which may follow block 610, the bit ranking associated with the data written on the memory page/block may be recovered using multiple read operations. These read operations may be performed by the memory controller, and may involve the sequential application of program pulses to one or more bits in the memory and reading the resulting values, as described above in FIG. 2. At block 614 ("Recover data from ranking"), which may follow block 612, the memory controller and/or the processing block may then recover the rank-modulated data from the recovered bit ranking.

Other modifications may be made to the processes described above. In some embodiments, a program vector may be determined using fewer program pulses per read operation. This reduction in the number of program pulses per operation may be equivalent to performing oversampling on the memory, and may result in better partial program resolution and reduced premature matriculation rates, since an operation with fewer program pulses may be less likely to cause multiple bits to switch. The reduction in the number of program pulses may be global (that is, for example, implemented over the entire memory), local (that is, for example, implemented over a portion of the memory), and/or adaptive (for example, dynamically changing based on the data to be written and memory conditions).

In further embodiments, the rank-modulated data program processes above may be used to provide security when transmitting data between two entities. For example, a first entity may wish to send rank-modulated data to a second entity. The first entity may derive a program vector corresponding to the rank-modulated data and divide the program vector into two (or more) portions. The first entity may then send a first portion to the second entity via some means, program a memory using a second portion of the program vector, and send the programmed memory to the second entity. The second entity may then continue to program the memory using the received first portion and then recover the rank-modulated data from the completely-programmed memory. In order to successfully intercept the data, an attacker would have to acquire both the first portion of the program vector and the programmed memory.

To further improve security and data reliability, a multi-bit representation may be used for individual bits in rank-modulated data to be written to memory. For example, two memory bits may be used to represent a single data bit, with memory bit values of "01" and "10" corresponding to data bit values of "0" and "1", respectively.

Figure 7:
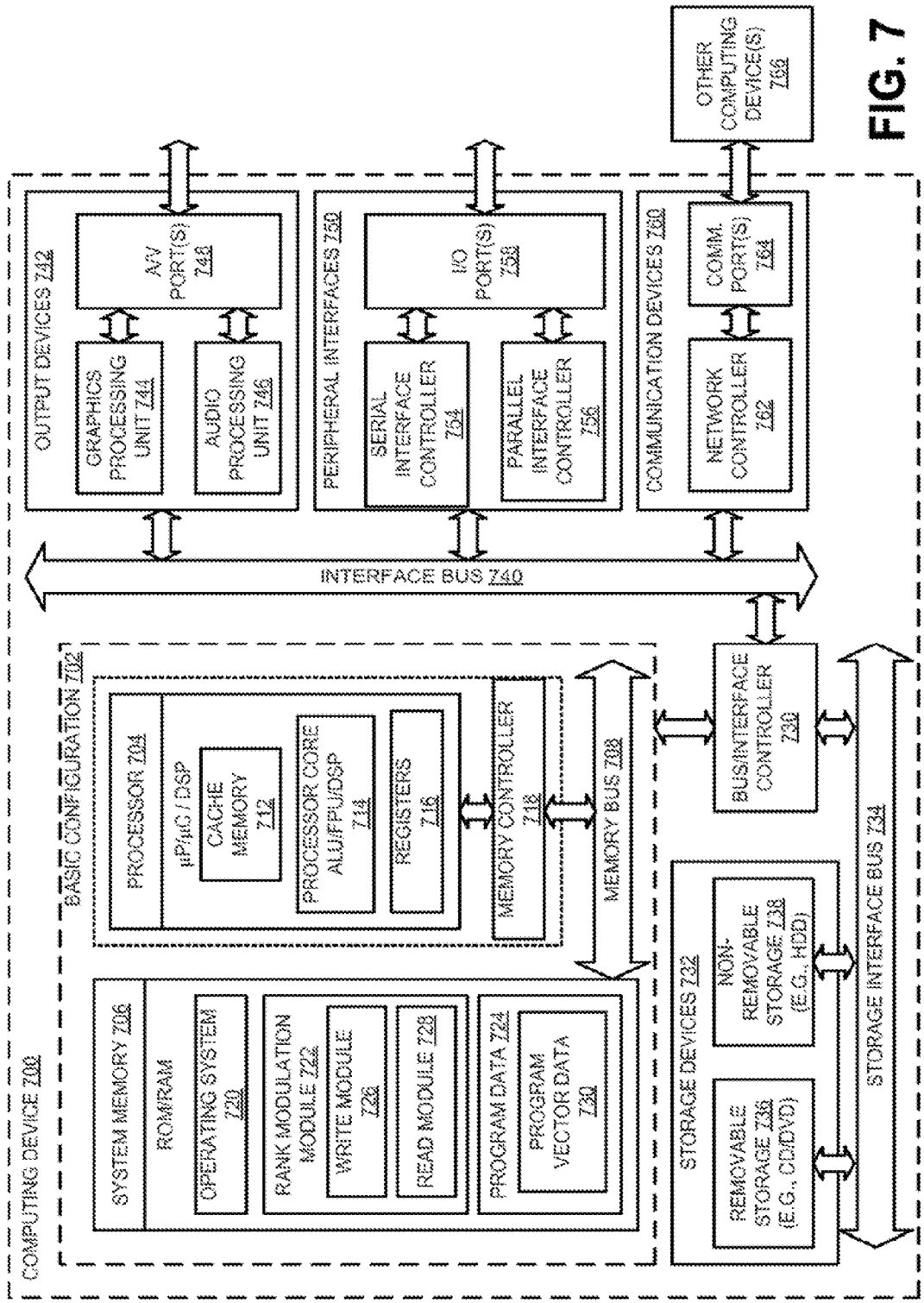
FIG. 7 illustrates a general purpose computing device, which may be used to provide data storage by use of rank modulation.

FIG. 7 illustrates a general purpose computing device, which may be used to provide data storage by use of rank modulation, arranged in accordance with at least some embodiments described herein.

For example, the computing device 700 may be used to program and recover data on single-level memory using partial programming as described herein. In an example basic configuration 702, the computing device 700 may include one or more processors 704 and a system memory 706. A memory bus 708 may be used to communicate between the processor 704 and the system memory 706. The basic configuration 702 is illustrated in FIG. 7 by those components within the inner dashed line.

Depending on the desired configuration, the processor 704 may be of any type, including but not limited to a microprocessor (μP), as microcontroller (μC), a digital signal processor (DSP), or any combination thereof. The processor 704 may include one or more levels of caching, such as a level cache memory 712, a processor core 714, and registers 716. The example processor core 714 may include an arithmetic logic unit (ALU), a floating point unit (FPU), a digital signal processing core (DSP core), or any combination thereof. An example memory controller 718, similar to the memory controller 110, may also be used with the processor 704, or in some implementations the memory controller 718 may be an internal part of the processor 704. Furthermore, the memory cells 150 of FIG. 1 may be implemented in one or more of the cache memory 712, the system memory 706, and/or the storage devices 732.

Depending on the desired configuration, the system memory 706 may be of any type including but not limited to volatile memory (such as RAM), non-volatile memory (such as ROM, flash memory, etc.) or any combination thereof. The system memory 706 may include an operating system 720, a rank modulation module 722, and program data 724. The rank modulation module 722 may include a write module 726 and a read module 728 to implement data storage using rank modulation as described herein. The write module 726 and the read module 728 may be similar to the write module 130 and read module 140 of FIG. 1, respectively, except that in the example embodiment of FIG. 7, the write module 726 and the read module 728 are implemented in a rank modulation module 722 stored in the system memory 706, rather than being sub-components of a memory interface module (or other module) in the memory controller 718. The program data 724 may include, among other data, program vector data 730 or the like, as described herein.

The computing device 700 may have additional features or functionality, and additional interfaces to facilitate communications between the basic configuration 702 and any desired devices and interfaces. For example, a bus/interface controller 730 may be used to facilitate communications between the basic configuration 702 and one or more data storage devices 732 via a storage interface bus 734. The data storage devices 732 may be one or more removable storage devices 736, one or more non-removable storage devices 738, or a combination thereof. Examples of the removable storage and the non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

The system memory 706, the removable storage devices 736 and the non-removable storage devices 738 are examples of computer storage media. Computer storage media includes, but is not limited to, RAM, ROM, EEPROM, flash memory or other memory technology, CD-ROM, digital versatile disks (DVD), solid state drives, or other optical storage, magnetic cassettes, magnetic tape, magnetic disk storage or other magnetic storage devices, or any other medium which may be used to store the desired information and which may be accessed by the computing device 700. Any such computer storage media may be part of the computing device 700.

The computing device 700 may also include an interface bus 740 to facilitate communication from various interface devices (e.g., one or more output devices 742, one or more peripheral interfaces 750, and one or more communication devices 760) to the basic configuration 702 via the bus/interface controller 730. Some of the example output devices 742 include a graphics processing unit 744 and an audio processing unit 746, which may be configured to communicate to various external devices such as a display or speakers via one or more A/V ports 748. One or more example peripheral interfaces 750 may include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 760 includes a network controller 766, which may be arranged to facilitate communications with one or more other computing devices 766 over a network communication link via one or more communication ports 764. The one or more other computing devices 766 may include servers at a datacenter, customer equipment, and comparable devices.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 700 may be implemented as a part of a general purpose or specialized server, mainframe, or similar computer that includes any of the above functions. The computing device 700 may also be implemented as a personal computer including both laptop computer and non-laptop computer configurations.

Figure 8:
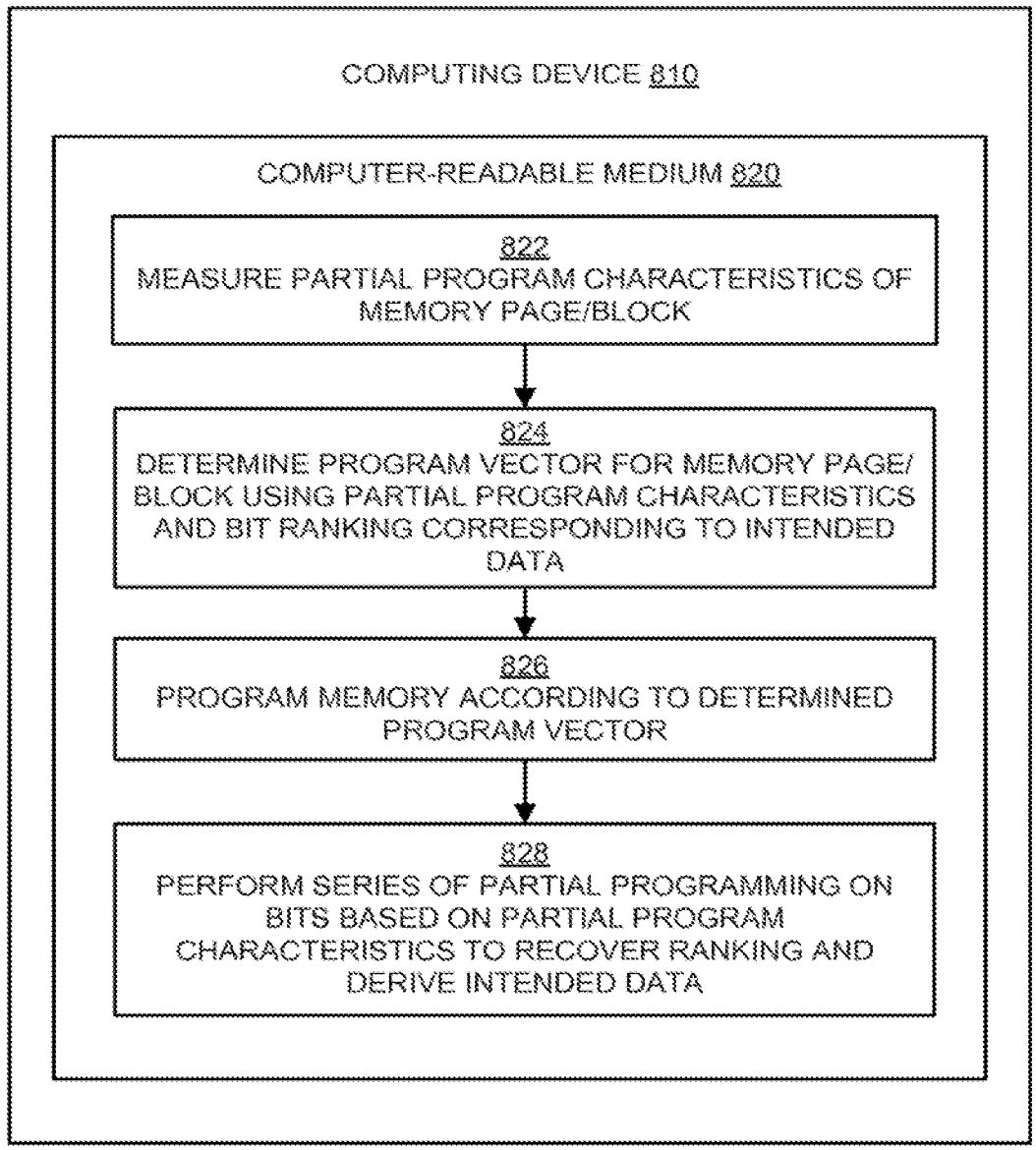
FIG. 8 is a flow diagram illustrating an example method to provide data storage using rank modulation that may be performed by a computing device such as that in FIG. 7.

FIG. 8 is a flow diagram illustrating an example method to provide data storage using rank modulation that may be performed by a computing device such as the computing device in FIG. 7, arranged in accordance with at least some embodiments described herein.

Example methods may include one or more operations, functions or actions as illustrated by one or more of blocks 822, 824, 826, and/or 828, and may in some embodiments be performed by a computing device such as the computing device 800 in FIG. 8. The operations described in the blocks 822-828 may also be performed in response to execution (by one or more processors) of computer-executable instructions stored in a computer-readable medium such as a non-transitory computer readable medium 820 of a computing device 810, and executable by one or more processors. In other embodiments, the various operations may be implemented/provided using methods alternatively or in addition to the execution of computer-executable instructions.

An example process to provide data storage using rank modulation may begin with block 822, "MEASURE PARTIAL PROGRAM CHARACTERISTICS OF MEMORY PAGE/BLOCK", where a memory controller (for example, the memory controller 110) may measure partial program characteristics of a memory page or block onto which rank-modulated data is to be written, as described above.

Block 822 may be followed by block 824, "DETERMINE PROGRAM VECTOR FOR MEMORY PAGE/BLOCK USING PARTIAL PROGRAM CHARACTERISTICS AND BIT RANKING CORRESPONDING TO INTENDED DATA", where the memory controller or a processing block may determine a program vector representing rank-modulated data based on a bit ranking associated with the data and partial program characteristics associated with the memory page/block, as described above. In some embodiments, the memory controller may perform one or more read-and-verify processes as described above in FIGS. 4-5, and the processing block may further refine the program vector based on the read-and-verify results, as described above.

Block 824 may be followed by block 826, "WRITE MEMORY ACCORDING TO DETERMINED PROGRAM VECTOR", where the memory controller may write data to the memory by the application of program pulses according to the previously-determined program vector, as described above.

Block 826 may be followed by block 828, "PERFORM SERIES OF PARTIAL PROGRAMMING ON BITS BASED ON PARTIAL PROGRAM CHARACTERISTICS TO RECOVER RANKING AND DERIVE INTENDED DATA", where the memory controller may recover the rank-modulated data written to the memory page or block by performing a series of partial programming on one or more bits in the memory page or block. For example, the memory controller may sequentially apply program pulses to one or more bits in the memory and read the resulting bit values to recover the bit ranking, as described above in FIG. 2. Once the bit ranking is recovered, the memory controller or the processing block may derive the intended data from the recovered bit ranking.

Figure 9:
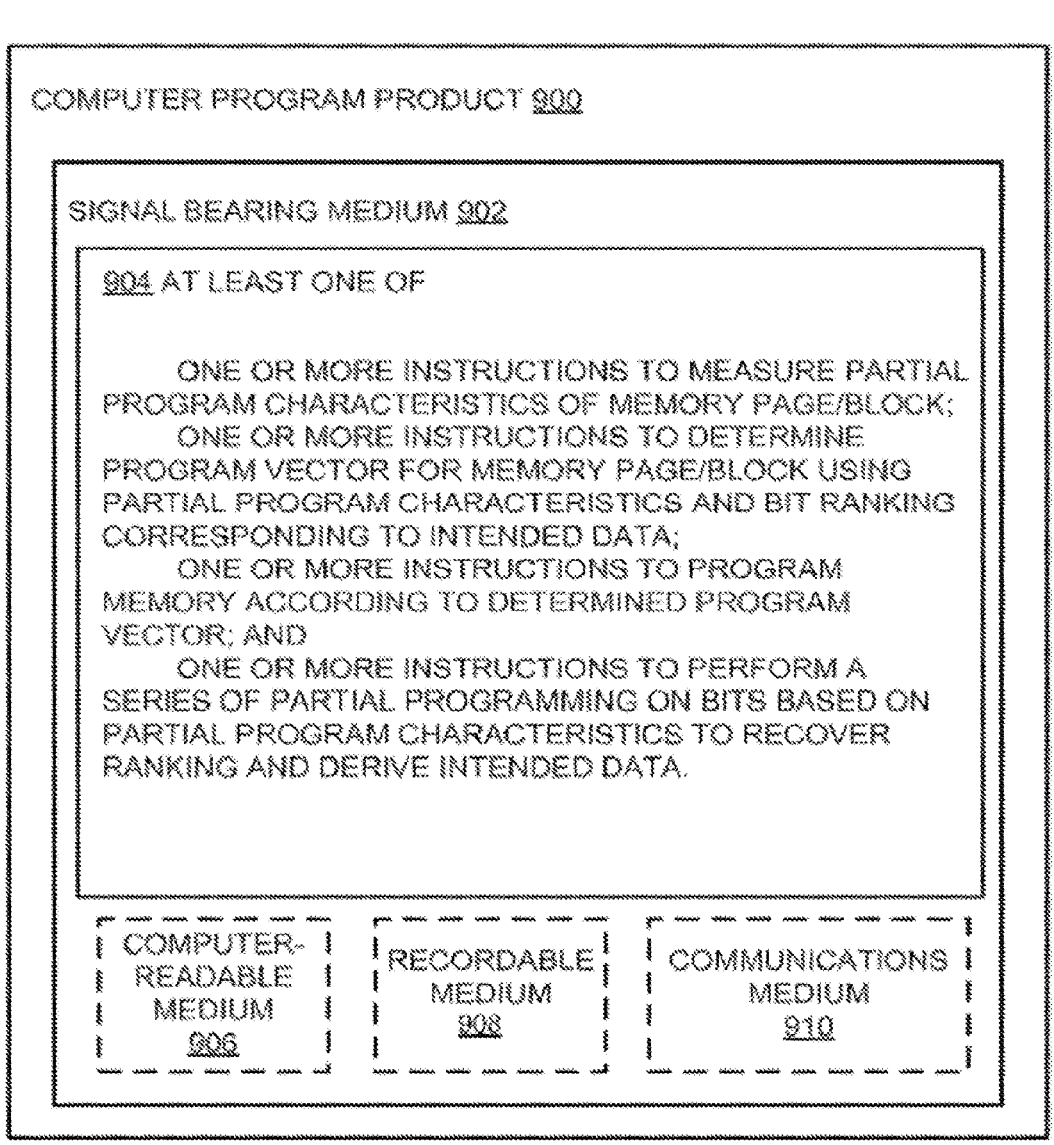
FIG. 9 illustrates a block diagram of an example computer program product, all arranged in accordance with at least some embodiments described herein.

FIG. 9 illustrates a block diagram of an example computer program product, arranged in accordance with at least some embodiments described herein.

In some examples, as shown in FIG. 9, a computer program product 900 may include a signal bearing medium 902 that may also include one or more machine readable instructions 904 that, in response to execution by, for example, a processor may provide the functionality and features described herein. Thus, for example, referring to the processor 704 in FIG. 7, the rank modulation module 722 may undertake one or more of the tasks shown in FIG. 9 in response to the instructions 904 conveyed to the processor 704 by the signal bearing medium 902 to perform actions associated with data storage using rank modulation as described herein. Some of those instructions may include, for example, instructions to measure partial program characteristics of a memory page/block, determine a program vector for the memory page/block using the partial program characteristics and a bit ranking corresponding to intended data, program the memory according to the determined program vector and/or perform a series of partial programming on bits based on the partial program characteristics to recover the ranking and derive the intended data, according to some embodiments described herein.

In some implementations, the signal bearing medium 902 depicted in FIG. 9 may encompass computer-readable medium 906, such as, but not limited to, a hard disk drive (HDD), a solid state drive (SSD), a Compact Disc (CD), a Digital Versatile Disk (DVD), a digital tape, memory, etc. In some implementations, the signal bearing medium 902 may encompass recordable medium 908, such as, but not limited to, memory, read/write (R/W) CDs, R/W, DVDs, etc. In some implementations, the signal bearing media 902 may encompass communications media 910, such as, but not limited to, a digital and/or an analog communication medium (e.g., a fiber optic cable, a waveguide, a wired communication link, a wireless communication link, etc.). Thus, for example, the computer program product 900 may be conveyed to one or more modules of the processor 704 by an RF signal bearing medium, where the signal bearing medium 902 is conveyed by the wireless communications medium 910 (e.g., a wireless communications medium conforming with the IEEE 802.11 standard).

According to some examples, methods to encode data on single-level flash memory by use of rank modulation are described. An example method may include determining a bit ranking within a group of bits based on the data to be encoded; determining a plurality of partial program parameters for a plurality of flash memory bits, where each partial program parameter is associated with a respective bit in the plurality of bits; determining a program vector based on the determined bit ranking and the determined plurality of partial program parameters; and/or encoding the data to the plurality of bits using partial programming, based on the determined program vector.

According to other examples, determining the plurality of partial program parameters may include selecting the partial program parameters based on one or more of a number of program pulses to modify the respective bit in the plurality of bits from a first value to a second value and a program time to modify the respective bit in the plurality of bits from the first value to the second value. The program vector may indicate at least one program parameter including at least one of a number of program pulses and a program time, and encoding the data may include partially programming the plurality of bits by programming according to the at least one program parameter to at least one bit in the plurality of bits.

According to further examples, determining the program vector further may include reducing the at least one program parameter to perform oversampling. The method may also include performing a program-and-verify sequence on the encoded data; adjusting the determined program vector based on the program-and-verify sequence; and re-encoding the data to the plurality of bits using partial programming based on the adjusted program vector. Performing the program-and-verify sequence may include performing at least one read operation on the data encoded to the plurality of bits and determining, based on the at least one read operation, whether at least one of delayed matriculation and premature matriculation has occurred in association with at least one bit in the plurality of bits. Adjusting the determined program vector may include adjusting a program parameter in the determined program vector associated with the at least one bit in response to determination that at least one of the delayed matriculation and the premature matriculation has occurred.

According to yet other examples, adjusting the determined program vector may further include adjusting another program parameter in the program vector associated with at least one other bit in the plurality of bits. Adjusting the program parameter may include one or more of: increasing a number of program pulses to the at least one bit; increasing a program time to the at least one bit; decreasing a number of program pulses to the at least one bit; decreasing the program time to the at least one bit; and applying a number of erase pulses to the at least one bit. Determining the program vector may include determining a complete program vector based on the bit ranking and the plurality of partial program parameters dividing the complete program vector into a first program vector portion and a second program vector portion; and encoding the data based on the first program vector portion.

According to other examples, an apparatus may be configured to write data in single-level flash memory by use of rank modulation. An example apparatus may include a processing block configured to determine a bit ranking based on a data to be written; determine a plurality of complete program durations for a plurality of bits of a flash memory, where each complete program duration indicates a respective program time duration to modify a respective bit in the plurality of bits from a first value to a second value; and determine a program vector based on the determined bit ranking and the determined plurality of complete program durations, the program vector being indicative of at least one partial program duration. The example apparatus may also include a memory interface module coupled to the processing block. The memory interface module may be configured to receive the determined program vector from the processing block; and write the data to the plurality of bits by partial program of the plurality of bits according to the at least one partial program duration indicated by the received program vector.

According to some examples, each complete program duration may be based on a number of program pulses corresponding to the respective program time durations; and the at least one partial program duration may include at least one of: a program time to at least partially modify at least one bit in the plurality of bits from the first value to the second value; and a number of program pulses corresponding to the program time. The processing block may be further configured to determine the program vector by reduction of at least one program parameter adaptively to perform oversampling.

According to yet other examples, the processing block may be further configured to control performance of a program-and-verify sequence on the written data and adjust the determined program vector based on the program-and-verify sequence. The memory program module may be further configured to receive the adjusted program vector and rewrite the data to the plurality of bits by use of a partial program operation based on the adjusted program vector. The processing block may also be configured to control performance of the program-and-verify sequence by control of performance of at least one read operation on the data written to the plurality of bits and determination of, based on the at least one read operation, whether at least one of delayed matriculation and premature matriculation has occurred in association with at least one bit in the plurality of bits. The processing block may be further configured to adjust the determined program vector by at least one of adjustment of the at least one partial program duration in the determined program vector associated with the at least one bit in response to determination that at least one of the delayed matriculation and the premature matriculation has occurred and adjustment of another partial program duration in the program vector associated with at least one other bit in the plurality of bits.

According to further examples, methods to retrieve data encoded in single-level flash memory by use of rank modulation may be described. An example method may include performing a plurality of read operations on a plurality of bits of the flash memory, where each read operation includes partially programming the plurality of bits based on at least one partial program parameter; and reading a state of the partially-programmed plurality of bits. The example method may also include determining a ranking associated with the plurality of bits based on at least the respective read states associated with the plurality of read operations and deriving a final data based on the determined ranking.

According to yet further examples, the method may also include reading an initial state of the plurality of bits before performing the plurality of read operations, and where determining the ranking comprises determining the ranking based on the initial state and the respective read states associated with the plurality of read operations. Determining the ranking may include determining the ranking based on at least the respective read states associated with the plurality of read operations and a multi-bit representation for at least one bit in the bit ranking.

According to yet other examples, an apparatus may be configured to retrieve data encoded in single-level flash memory by use of rank modulation. The apparatus may include a memory interface module coupled to a plurality of flash memory bits and a processing block coupled to the memory interface module. The memory interface module may read an initial state of the plurality of flash memory bits and perform a plurality of read operations on the plurality of bits by performance of a partial program of the plurality of bits based on at least one partial program duration, where the at least one partial program duration indicates a program time to partially modify at least one bit in the plurality of bits from a first value to a second value, and performance of a read of a state of the partially-programmed plurality of bits. The processing block may receive, from the memory interface module, the respective read states associated with the plurality of read operations; determine a ranking associated with the plurality of bits based on the respective read states; and derive a final data based on the ranking.

According to some examples, the at least one partial program duration may be based on a number of program pulses corresponding to the program time. The memory interface module may further perform the plurality of read operations by reduction of the at least one partial program duration to perform oversampling.

Various embodiments may be implemented in hardware, software, or combination of both hardware and software (or other computer-readable instructions stored on a non-transitory computer-readable storage medium and executable by one or more processors); the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs executing on one or more computers (e.g., as one or more programs executing on one or more computer systems), as one or more programs executing on one or more processors (e.g., as one or more programs executing on one or more microprocessors), as firmware, or as virtually any combination thereof, and designing the circuitry and/or writing the code for the software and/or firmware are possible in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. Also, the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive (HDD), a Compact Disc (CD), a Digital Versatile Disk (DVD), a digital tape, a computer memory, a solid state drive, etc.; and a transmission type medium such as a digital and/or an analog communication medium (e.g., a fiber optic cable, a waveguide, a wired communication link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A data processing system may include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity of gantry systems; control motors to move and/or adjust components and/or quantities).

A data processing system may be implemented utilizing any suitable commercially available components, such as those found in data computing/communication and/or network computing/communication systems. The herein described subject matter sometimes illustrates different components contained within, or connected with, different other components. Such depicted architectures are merely exemplary, and in fact, many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one of" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to retrieve data from memory, the method comprising:
   iteratively applying a series of partial program pulses to each memory cell of a plurality of memory cells;
   after the application of the series of partial program pulses, reading each memory cell of the plurality of memory cells;
   determining, based on the reading, a sequence in which each memory cell of the plurality of memory cells switches from a first value to a second value, wherein the first value and the second value correspond to two of discrete charge levels of the memory cells;
   determining, based on the sequence, a rank vector; and
   retrieving data written in the plurality of memory cells by processing the rank vector.

2. The method of claim 1, wherein iteratively applying the series of partial program pulses comprises applying the series of partial program pulses until each memory cell of the plurality of memory cells switches from the first value to the second value.

3. The method of claim 1, wherein the plurality of memory cells are included in a single-level flash memory.

4. The method of claim 1, wherein iteratively applying the series of partial program pulses comprises:
   applying the series of partial program pulses to at least some memory cells of the plurality of memory cells that have the first value; and
   subsequently applying the series of partial program pulses to one or more memory cells, of the plurality of memory cells, wherein the one or more memory cells retain the first value after application of the series of partial program pulses in a preceding operation of applying.

5. The method of claim 1, wherein reading each memory cell of the plurality of memory cells comprises reducing at least one partial program duration to perform oversampling.

6. The method of claim 1, wherein iteratively applying the series of partial program pulses comprises applying one or more partial program pulses that lead to switching of at least one memory cell, of the plurality of memory cells, from the first value to the second value.

7. The method of claim 1, further comprising:
   after the reading, determining an occurrence of one of a premature matriculation error or a delayed matriculation error.

8. The method of claim 7, further comprising:
   in response to the determination of the occurrence of one of the premature matriculation error or the delayed matriculation error, updating a number of program pulses associated with switching of one or more memory cells, of the plurality of memory cells, from the first value to the second value, wherein the one or more memory cells are associated with the premature matriculation error or the delayed matriculation error.

9. The method of claim 8, wherein updating the number of program pulses comprises one or more of:
   increasing the number of program pulses to be applied to at least one memory cell of the one or more memory cells;
   decreasing the number of program pulses associated with the at least one memory cell, of the one or more memory cells, in the rank vector; and
   applying one or more erase pulses to the at least one memory cell of the one or more memory cells.

10. The method of claim 7, further comprising:
    in response to the determination of the occurrence of the premature matriculation error or the delayed matriculation error, updating the rank vector.

11. The method of claim 10, further comprising retrieving the data written in the plurality of memory cells by processing the updated rank vector.

12. A method to write data in memory, the method comprising:
    determining a rank vector for a plurality of memory cells;
    determining, based on the rank vector, a respective number of partial program pulses to modify each memory cell, of the plurality of memory cells, from a first value to a second value, wherein the first value and the second value correspond to two of discrete charge levels of the memory cells; and
    applying the respective number of partial program pulses to each memory cell of the plurality of memory cells, to encode data by using rank modulation.

13. The method of claim 12, wherein the plurality of memory cells are included in a single-level flash memory.

14. The method of claim 12, wherein applying the respective number of partial program pulses comprises applying a particular number of partial program pulses, resulting in a modification of a single memory cell, of the plurality of memory cells, from the first value to the second value.

15. The method of claim 12, wherein applying the respective number of partial program pulses to each memory cell comprises applying a most number of partial program pulses to a memory cell ranked first in the rank vector, and applying a least number of partial program pulses to a memory cell ranked last in the rank vector.

16. The method of claim 12, wherein determining the rank vector includes receiving the rank vector.

17. The method of claim 12, wherein the plurality of memory cells are included in a memory page or a memory block.

18. The method of claim 17, further comprising, prior to applying the respective number of partial program pulses to each memory cell of the plurality of memory cells:
measuring partial program characteristics of the memory page or the memory block; and
erasing the memory page or the memory block.

19. An apparatus configured to retrieve data from memory, the apparatus comprising:
read circuitry coupled to the memory and configured to read a respective initial state of each memory cell of a plurality of memory cells of the memory;
program circuitry coupled to the memory and configured to iteratively apply a series of partial program pulses to each memory cell of the plurality of memory cells, wherein the application of the series of partial program pulses results in a modification of the respective initial state of at least one memory cell from a first value to a second value,
wherein after the application of the series of partial program pulses, the read circuitry is configured to read a respective current state of each memory cell of the plurality of memory cells; and
a controller coupled to the read circuitry and the program circuitry, and configured to:
in response to a determination that the respective current state of each memory cell, of the plurality of memory cells, corresponds to the second value, determine a ranking associated with the plurality of memory cells; and
derive data written in the plurality of memory cells based on the ranking,
wherein the memory includes a single-level flash memory, and wherein the plurality of memory cells are included in a memory page of the single-level flash memory or a memory block of the single-level flash memory.

20. An apparatus configured to write data in memory, the apparatus comprising:
a controller configured to:
determine a rank vector for a plurality of memory cells of the memory; and
determine, based on the rank vector, a respective number of partial program pulses to modify each memory cell, of the plurality of memory cells, from a first value to a second value; and
program circuitry coupled to the controller and configured to apply the respective number of partial program pulses to each memory cell, of the plurality of memory cells,
wherein the application of a particular number of partial program pulses results in a modification of a single memory cell, of the plurality of memory cells, from the first value to the second value, and
wherein the memory includes a single-level flash memory, and wherein the plurality of memory cells are included in a memory page of the single-level flash memory or a memory block of the single-level flash memory.

* * * * *